United States Patent
Sonoda (10) Patent No.: US 8,094,220 B2
(45) Date of Patent: Jan. 10, 2012

(54) SOLID-STATE IMAGING APPARATUS AND DRIVING METHOD OF SOLID-STATE IMAGING APPARATUS

(75) Inventor: Kazuhiro Sonoda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 425 days.

(21) Appl. No.: 12/429,767

(22) Filed: Apr. 24, 2009

(65) Prior Publication Data

US 2009/0273697 A1    Nov. 5, 2009

(30) Foreign Application Priority Data

Apr. 30, 2008    (JP) .................................. 2008-118807

(51) Int. Cl.
*H04N 3/14*    (2006.01)

(52) U.S. Cl. ...... 348/294; 348/302; 348/323; 250/208.1

(58) Field of Classification Search .......... 348/294–324; 341/155, 172; 250/208.1

See application file for complete search history.

(56) References Cited

U.S. PATENT DOCUMENTS

| | | | |
|---|---|---|---|
| 7,692,702 B2 * | 4/2010 | Sano | 348/300 |
| 2006/0044440 A1 * | 3/2006 | Park et al. | 348/308 |
| 2008/0225145 A1 * | 9/2008 | Sonoda | 348/294 |
| 2008/0266434 A1 | 10/2008 | Sugawa et al. | 348/308 |
| 2008/0291290 A1 | 11/2008 | Sonoda et al. | 348/222.1 |
| 2009/0219424 A1 | 9/2009 | Sonoda et al. | 348/302 |

FOREIGN PATENT DOCUMENTS

| JP | 2005-328493 A | 11/2005 |
|---|---|---|
| JP | 2006-025189 A | 1/2006 |

* cited by examiner

*Primary Examiner* — Huy K Mai (74) *Attorney, Agent, or Firm* — Fitzpatrick, Cella, Harper & Scinto (57) ABSTRACT

A solid-state imaging apparatus includes an A/D conversion circuit in each column. A connecting unit is provided for connecting a register circuit in a certain column to a register circuit in another column, and an operation is performed for holding, in register circuits through the connecting unit, digital signals obtained by performing A/D conversions of analog electric signals at different timings in one horizontal synchronizing period.

7 Claims, 8 Drawing Sheets

SOLID-STATE IMAGING APPARATUS AND DRIVING METHOD OF SOLID-STATE IMAGING APPARATUS

BACKGROUND OF THE INVENTION

1. Field of the Invention

The present invention relates to a solid-state imaging apparatus and more particularly to a solid-state imaging apparatus including an A/D conversion circuit in each column of pixels in a matrix to perform arithmetic processing to an obtained plurality of digital signals, and relates to a driving method of the solid-state imaging apparatus.

2. Description of the Related Art

In a conventional solid-state imaging apparatus, for example, it is known to read out an analog electric signal converted from an incident light in each pixel on every other column of the pixels arranged in a matrix, that is, the so-called horizontal skipped readout (having the same meaning as a horizontal thinning-out operation in the disclosure below), in the use of needing a high speed operation, such as a moving image.

Moreover, Japanese Patent Application Laid-Open No. 2006-025189 discloses the provision of an A/D conversion circuit to each column of pixels to perform the arithmetic processing of a digitized signal. To put it concretely, Japanese Patent Application Laid-Open No. 2006-025189 describes an image sensor provided with two register circuits per pixel column to store two different signal levels in the same pixel. After the storage, the image sensor operates the difference of the two signal levels in a digital region.

Moreover, solid-state imaging apparatus have required to have a wide dynamic range, and various techniques for the widening have been proposed. For example, Japanese Patent Application Laid-Open No. 2005-328493 discloses the configuration of providing an accumulation capacitor element for holding the charges overflowing from a photoelectric conversion element of each pixel. Besides the configuration, there is the technique of expanding a dynamic range on the basis of a signal based on a longer accumulation operation and a shorter accumulation operation.

If a horizontal thinning-out operation is performed in the circuit configuration disclosed in the aforesaid Japanese Patent Application Laid-Open No. 2006-025189 and an operation is performed on the basis of a signal held in each of the plurality of register circuits, then the A/D converters and register circuits in thinned-out, i.e., not read-out, columns become the state of not participating with the operation. The state admits of an examination in the aspect of the utilization efficiency of the circuits. Furthermore, the circuit configuration is required to expand the dynamic range thereof.

SUMMARY OF THE INVENTION

The present invention is directed to provide a solid-state imaging apparatus comprising: a plurality of pixels arranged in a matrix, each photoelectrically converting an incident light into an analog electric signal and outputting the analog electric signal; an A/D converter arranged correspondingly to each of columns of the pixels, for A/D converting the analog electric signal from the pixel into a digital signal and for outputting the digital signal from an output terminal of the A/D converter; a register circuit arranged correspondingly to each of the columns of the pixels; and a connecting unit for connecting the output terminal of the A/D converter arranged correspondingly to one column of the pixels to an input terminal of the register circuit arranged correspondingly to the one column of the pixels, for connecting the output terminal of the A/D converter arranged correspondingly to the one column of the pixels to an input terminal of the register circuit arranged correspondingly to another column of the pixels, or for connecting an output terminal of the register circuit arranged correspondingly to the one column of the pixels to the input terminal of the register circuit arranged correspondingly to the another column of the pixels, wherein the register circuit arranged correspondingly to the one column of the pixels receives by the input terminal thereof the digital signal from the output terminal of the A/D converter or from the output terminal of the register circuit arranged correspondingly to the other column of the pixels, and the analog electric signal from one of the pixels based on the incident light is A/D converted by the A/D converter in different timings within one horizontal synchronizing period to a plurality of the digital signals, and the plurality of the digital signals are held by different ones of the register circuits through the connecting unit.

According to the present invention, even if an operation is performed by using the digital signals held in a plurality of register circuits, the number of the register circuits that do not participate in the operation can be decreased, and the utilization efficiency of the circuits can be improved. Furthermore, the dynamic ranges of the circuits can be also expanded.

Further features of the present invention will become apparent from the following description of exemplary embodiments with reference to the attached drawings.

DESCRIPTION OF THE EMBODIMENTS

In the following, the exemplary embodiments according to the present invention will be described.

First Embodiment

First, the circuit configuration of a solid-state imaging apparatus according to a first embodiment of the present invention will be described. Next, an operation will be described in which a digital signal held in a register circuit of a column to be read out in a horizontal thinning-out operation is transferred to a register circuit of a column not to be read out in the horizontal thinning-out operation and arithmetic processing is performed to a plurality of digital signals based on the pixels in different rows in the column not to be read out. After that, a read-out operation capable of expanding a dynamic range according to one embodiment of the present invention will be described.

Figure 1:
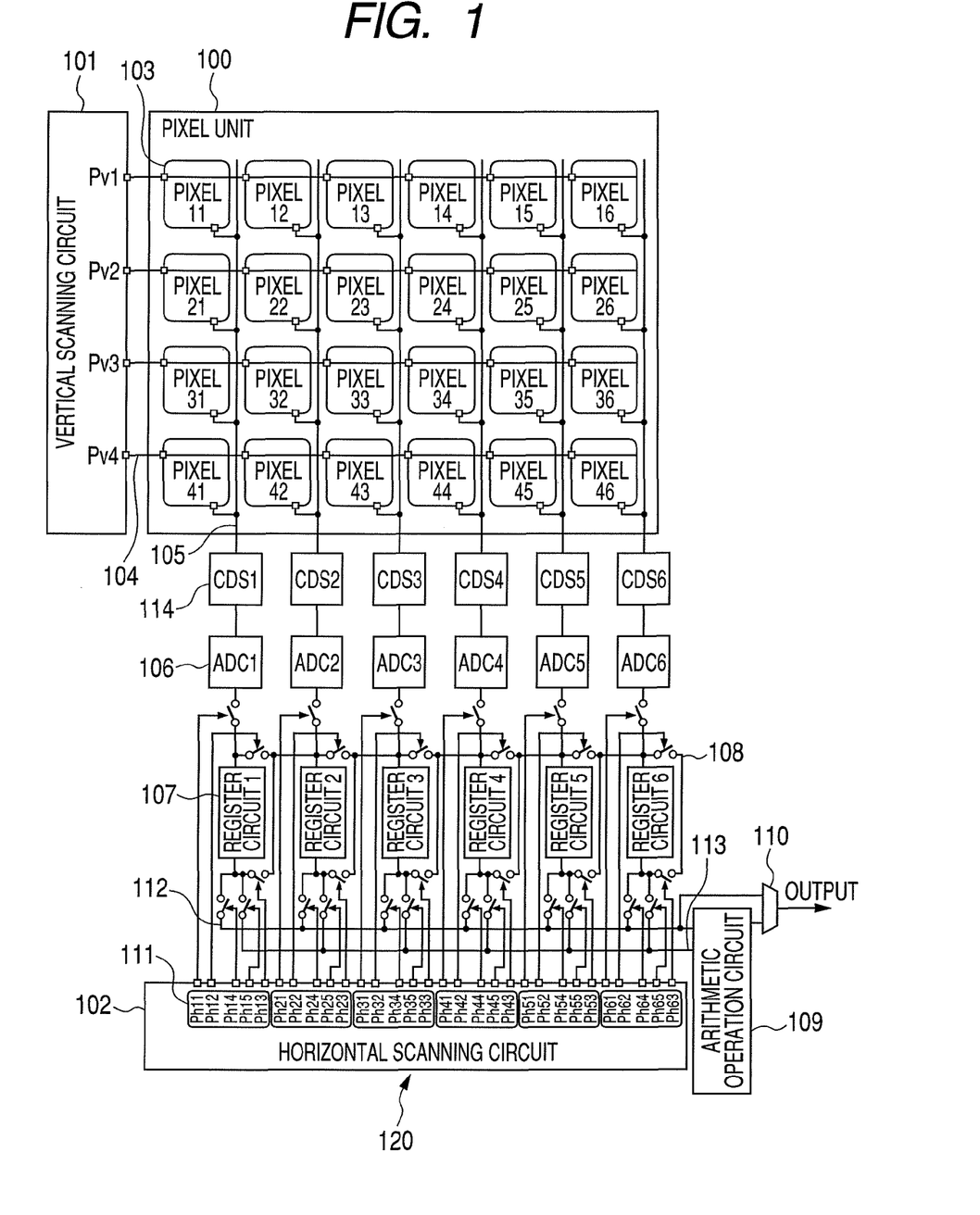
FIG. 1 is a block diagram of a solid-state imaging apparatus according to an embodiment of the present invention.

FIG. 1 is a block diagram illustrating a solid-state imaging apparatus according to the first embodiment of the present invention. A pixel unit 100 includes pixels 103, each including a photoelectric conversion element converting an incident light into charges to output the converted charges as an analog electric signal, the pixels 103 arranged in a matrix of six pixels in a horizontal direction and four pixels in a vertical direction. The pixels 103 constituting one row are commonly connected to a vertical scanning circuit 101 with a row selection line 104, and the six pixels 103 connected to a selected row selection line 104 are simultaneously selected. The pixels 103 in a first row through a fourth row are sequentially selected by sequentially changing the row selection signals Pv1 to Pv4 to the high level.

The analog electric signals output from the pixels 103 in a row selected by the row selection line 104 are input into correlated double sampling (CDS) circuits 114 provided in the respective columns of the pixel unit 100 through vertical output lines 105, to each of which the pixels 103 in each column are commonly connected. The CDS circuits 114 performs noise cancellation by performing subtraction processing of the noise level included in an analog electric signal and a signal level. Although the vertical output lines 105 directly connected to the CDS circuits 114 in FIG. 1, respectively, amplifiers for amplifying the analog electric signals from the pixels 103 may be connected between the pixel unit 100 and the CDS circuits 114, respectively, to decrease the influences of noise components superposed on the analog electric signals. The analog electric signal, which has been subjected to noise cancellation, of each column is input into an A/D converter (ADC) 106 provided to each column. The analog electric signal input into the ADC 106 is converted into a digital signal by the ADC 106. The converted digital signal is output from the output terminal of the A/D converter 106, and a register circuit 107 provided to each column of the pixels 103 receives the input digital signal at the input terminal thereof to hold the digital signal therein.

The digital signal held in the register circuit 107 is output from the output terminal of the register circuit 107 to a horizontal output line 112 or 113 by a suitable selection of the register circuit 107 by a horizontal scanning circuit 102. For example, when the horizontal scanning circuit 102 makes the transitions of column selection signals Ph14, Ph24, . . . to the high level in that order, the digital signal held in each of the register circuits 107 is sequentially output from the register circuits 1-6 to the horizontal output line 112. The digital signals output to the horizontal output line 112 are output through a selector 110.

Moreover, the horizontal scanning circuit 102 makes the digital signal held in each of the register circuits 1 to 6 output to a horizontal output line 113 in order by changing column selection signals Ph15, Ph25, . . . to the high level in that order. When the digital signals are simultaneously output to the horizontal output lines 112 and 113, an arithmetic operation circuit 109, to which the horizontal output lines 112 and 113 are connected in parallel to each other, performs the arithmetic processing, such as addition, subtraction, and averaging, of both the digital signals simultaneously input from the horizontal output lines 112 and 113, and the arithmetic operation circuit 109 outputs the arithmetic processing result to the outside through the selector 110. Although the two horizontal output lines 112 and 113 are connected to the arithmetic operation circuit 109 here, three or more horizontal output lines may be connected to the arithmetic operation circuit 109, that is, the configuration of performing operations to three or more digital signals may be adopted.

In the present embodiment, the selector 110 selects one of a signal obtained by performing arithmetic processing to the two digital signals read out into the horizontal output lines 112 and 113 and a signal read out into the horizontal output line 112 and not being subjected to any arithmetic processing, and the selector 110 outputs the selected signal to the outside.

Although the six pixel columns in a horizontal direction are grouped into two blocks, each composed of three pixel columns in the present embodiment, the advantages of the present invention do not change even if the pixel columns per block is increased or the six pixel columns in a horizontal direction are grouped into three or more blocks.

Figure 2:
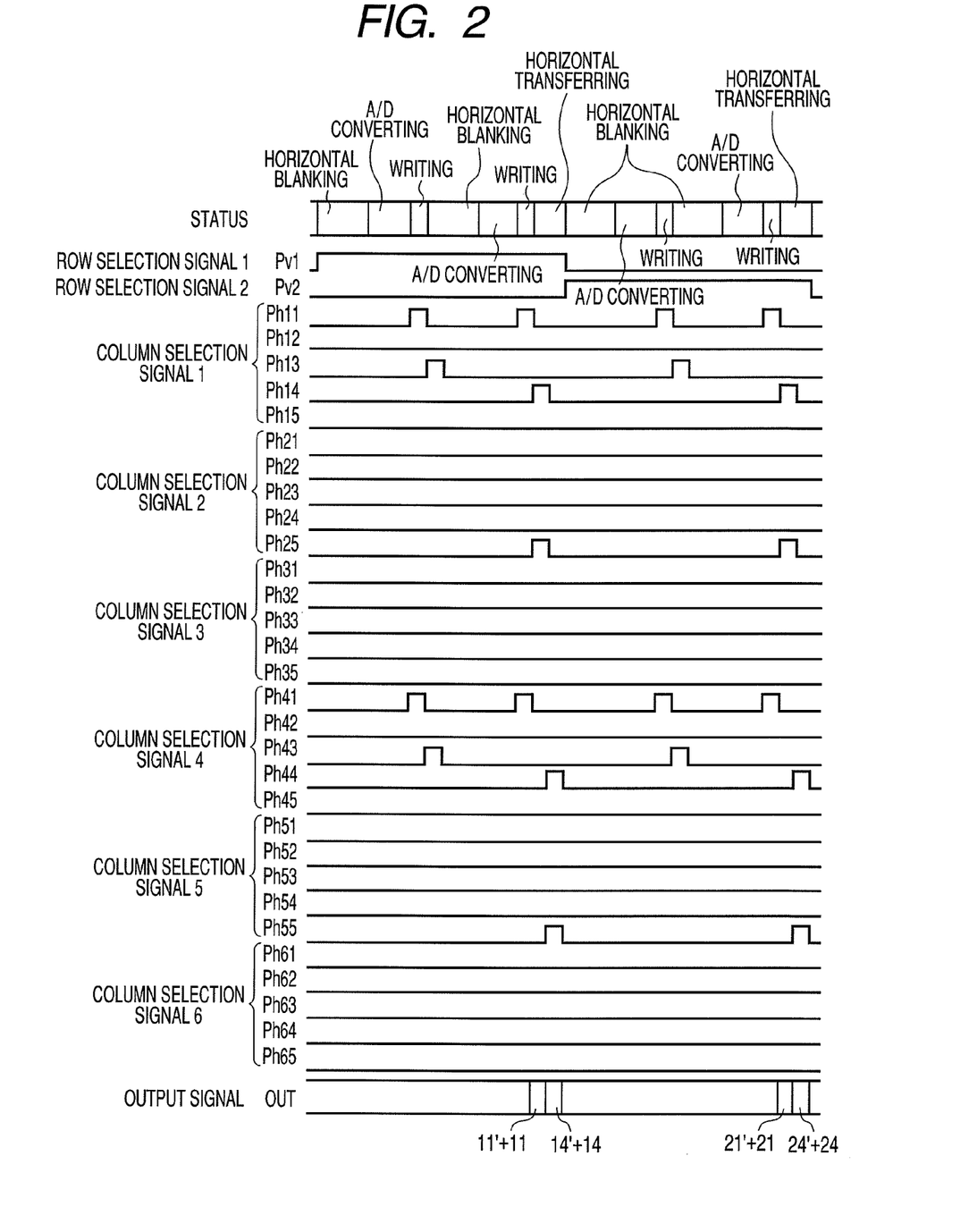
FIG. 2 is a timing chart illustrating a driving method of a solid-state imaging apparatus according to a first embodiment of the present invention.

The timing chart illustrated in FIG. 2 illustrates a driving method for reading out signals in an expanded dynamic range according to the present embodiment, and illustrates a horizontal thinning-out operation of not reading out the pixels in the second, third, fifth, and sixth columns among the pixels in a matrix of six columns in a horizontal direction and four rows in a vertical direction. Two different signals of each pixel in the first and fourth rows to be read out are obtained by performing a read-out operation two times per pixel and are subjected to the arithmetic processing to be output to the outside of the solid-state imaging apparatus. In order to read out a signal under an expanded dynamic range, it is necessary to read out signals based on incident lights at least two times from one pixel in a horizontal synchronizing period, during which the pixels in one row are being selected.

In FIG. 2, the pixels in the first row are selected during the period in which the row selection signal Pv1 takes the high level. In a first horizontal blanking status of the first row, an incident light is converted into analog electric signals in the photoelectric conversion elements of the pixels in the first row, and the converted analog electric signals are read out into the respective vertical output lines 105. The read out analog electric signals are converted into digital signals in a successive first A/D converting status. The converted digital signals are held in the register circuit 1 in a first writing status.

Next, the analog electric signals from the pixels in the first row are read out to the vertical output lines 105 in a second horizontal blanking status of the first row. The analog electric signals read out to the vertical output lines 105 have different levels from those of the analog electric signals read out in the first horizontal blanking status here, and, for example, the levels are those of the analog electric signals generated by exposure in a shorter accumulation time than that at the first readout. Moreover, the levels of the analog electric signals may be the ones of the analog electric signals generated in the state of altered magnitudes of holding capacities to be connected to the respective floating diffusion portions in a configuration described below. A column selection signal Ph13 is changed to the high level in parallel with the operation of the readout of the analog electric signals from the pixels in the first row in the second horizontal blanking status. The digital signal held in the register circuit 1 in the first writing status is hereby transferred to the register circuit 2. The analog electric signal read out in the second horizontal blanking status is converted into a digital signal in a successive second A/D converting status and is held in the register circuit 1 in a second writing status.

The digital signals held in the register circuits 1 and 2 are output to the horizontal output lines 112 and 113, respectively, in a horizontal transferring status, and the output digital signals are subjected to the arithmetic processing, such as addition and amplification, in the arithmetic operation circuit 109 to be generated as a pixel signal of a wide dynamic range. For example, a notation 11'+11 in OUTPUT SIGNAL in FIG. 2 indicates that the numeral 11' denotes a signal read out in the first horizontal blanking status and the numeral 11 denotes a signal read out in the second horizontal blanking status. The period in which the row selection signal Pv1 is taking the high level, that is, the period during which the operations of the pixels in the first row are performed, is defined as a horizontal synchronizing period here.

An image of a wide dynamic range can be obtained by also performing the operations similar to the one described above in and after the second row. That is, the dynamic range can be expanded by performing the A/D conversions of the analog electric signals based on incident lights into one pixel with an A/D converter at different timings in a horizontal synchronizing period to perform the operation of making register circuits hold the digital signals through a connecting unit.

Next, a more detailed operation in a horizontal blanking period in the operation illustrated in FIG. 2 is described together with the circuit configuration example.

Figure 3:
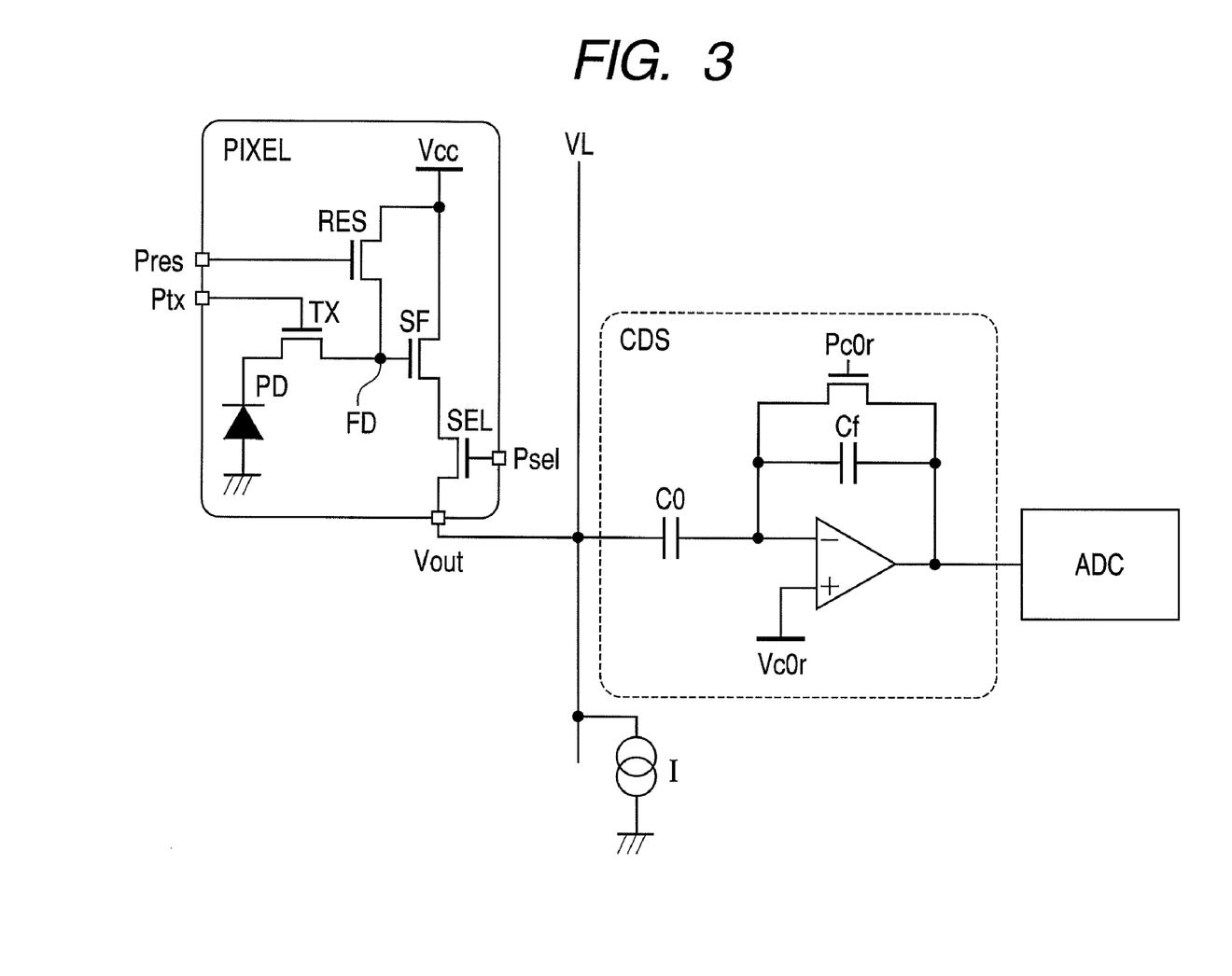
FIG. 3 is a diagram illustrating a configuration example of a pixel and a correlated double sampling (CDS) circuit according to the first embodiment of the present invention.

FIG. 3 is a diagram illustrating a concrete configuration example of a pixel and a CDS circuit. The pixel includes a photodiode PD, which is a photoelectric conversion portion, a transfer transistor TX, which is a transfer portion, an amplifying transistor SF, which is a pixel amplifying portion, a reset transistor RES, which is a reset portion, and a selection transistor SEL, which is a selection portion. When a signal Ptx changes to the high level, the transfer transistor TX is changed to be on in an electrical connection, and the charges accumulated in the photodiode PD are transferred to the gate of the amplifying transistor SF. A floating diffusion portion FD, which is a not illustrated capacity, exists in the node to which the gate of the amplifying transistor SF is connected, and the charges transferred from the photodiode PD are held in the floating diffusion portion FD. When a signal Psel changes to the high level, the selection transistor SEL is changed to be on in an electrical connection. Thereby the amplifying transistor SF and a constant current source I constitute a source follower circuit, and a signal level according to the potential of the gate of the amplifying transistor SF appears on a signal line VL. The signal line VL corresponds to one of the vertical output lines 105 in FIG. 1. When a signal Pres changes to the high level, the reset transistor RES changes to be on in an electrical connection, and the potential at the gate of the amplifying transistor SF is reset in accordance with the power source voltage Vcc. The signal level appearing in the signal line VL is input into an ADC 106, and an A/D conversion operation is performed. The signals Pres, Ptx, and Psel to be supplied to the respective elements included in the pixel and a signal Pc0r to be supplied to a CDS circuit are supplied from, for example, the vertical scanning circuit 101 here.

An operation from a first horizontal blanking period of a certain row to a second A/D converting period in the operation illustrated in FIG. 2 is described with reference to FIG. 4. It is supposed that an incident light has been radiated to the photodiode PD prior to a time t0 illustrated in FIG. 4 and charges based on the incident light are accumulated in the photodiode PD.

By a transition of the signal Pres to the low level at the time t0, the reset state of the floating diffusion portion FD of the pixel is released. At the same time, the signal Psel changes to the high level, and the pixel becomes the selected state. Consequently, the signal level according to the reset of the floating diffusion portion FD appears on the signal line VL and is input into one terminal (first terminal) of a clamp capacitor C0. The signal level includes a component generated by a drive of the reset transistor RES. Because the level of the component in each pixel is different from each other, or differs at each drive, the component operates as a noise component.

Moreover, the signal Pc0r also changes to the high level at the time t0. An amplifier Amp hereby becomes a buffer state, in which the inverting input terminal of the amplifier Amp and the output terminal thereof are short-circuited to each other. Then, a reference voltage is given to a node (second terminal) on the side of the clamp capacitor C0 on which side the clamp capacitor is connected to the inverting input terminal of the amplifier Amp.

The signal Pc0r makes a transition to the low level at a time t1, and consequently the signal level according to the reset of the floating diffusion portion FD is clamped.

The signal Ptx keeps the high level from a time t2 to a time t3, and the charges accumulated in the photodiode PD are thereby transferred to the floating diffusion portion FD. Then, the gate potential of the amplifying transistor SF changes according to the transferred charge quantity. In association with this, the signal level appearing on the signal line VL changes. At this timing, the signal Pc0r is at the low level, and the clamp capacitor C0 is in a floating state. Consequently, only a changed component from the clamped signal level at the time t1 is input into the inverting input terminal of the amplifier Amp. That is, a signal including the decreased noise components included in the signal level clamped at the time t1 is input into the amplifier Amp.

An accumulation time A ends at the time t3, when the transition of the signal Ptx to the low level is made, and also the first horizontal blanking period ends at that time. Moreover, a period from the time t3 to a time t4 corresponds to the first A/D converting period and the first writing period.

When the signals Pres and Ptx change to the high level at the time t4, which the second horizontal blanking period starts, the transfer transistor TX and the reset transistor RES are turned on into electrical connections. Consequently, the charges accumulated in the photodiode PD until then are discharged to the power source voltage Vcc. Then, when the signal Ptx makes a transition to the low level at a time t5, then the photodiode PD changes to the state capable of accumulating charges again, that is, an accumulation time B starts.

The signal Pres makes a transition to the low level at a time t6, and consequently the reset state of the floating diffusion portion is released. Because the operation in a period from the time t6 to a time t9 is similar to that in the period from the time t0 to the time t3, the description of the operation is omitted here. The accumulation time B, which is the period from the time t5 to the time t9, is supposed to be a period shorter than that of the accumulation time A. Accordingly, the accumulation times A and B are illustrated as a long period and a short period, respectively, in FIG. 4. Hereby, even if a signal accumulated in the accumulation time A reaches a saturated level, an image having a wide dynamic range can be obtained by synthesizing the signal with a signal accumulated in the accumulation time B.

The period from the time t9 to a time t10 corresponds to the second A/D converting period and the second writing period.

The signals Pres and Ptx change to the high level at the time t10, and the resetting of the photodiode PD is again started. The signals Ptx and Psel make transitions to the low level at a time t11, and consequently the reset state of the photodiode PD is released, and the selection states of the pixels in the first row are released.

By the operation described above, two signals held in register circuits in different columns are output as a signal having an expanded dynamic range after being processed by, for example, addition processing in the arithmetic operation circuit 109.

Incidentally, the operation of resetting the photodiode PD executed at the time t10 does not always need performing, but may be performed in a state in which no pixels are selected, such as at a timing after the signal Psel has made a transition to the low level, as long as the timing is the one after the second A/D converting period has ended.

Figure 4:
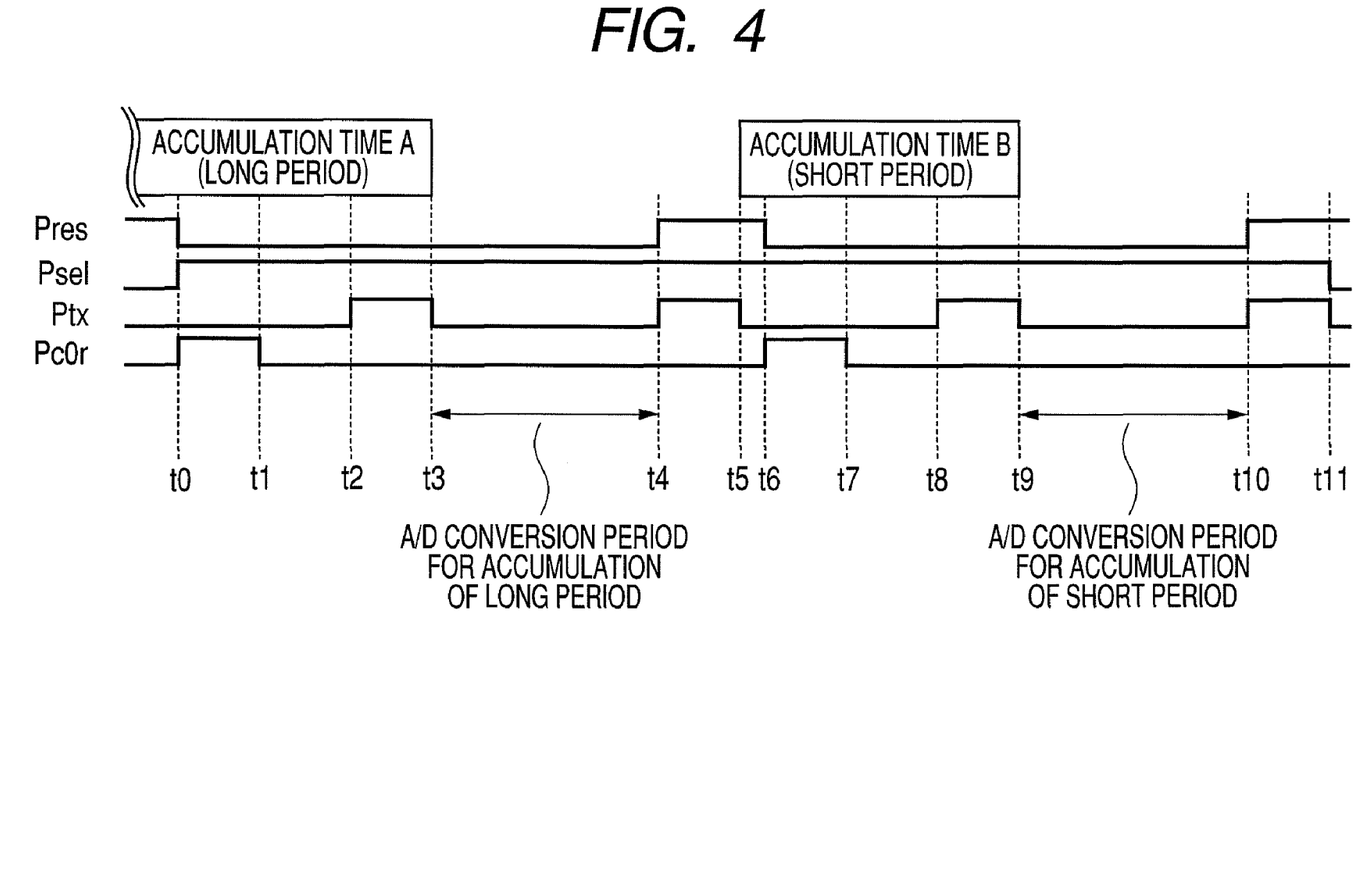
FIG. 4 is a timing chart illustrating a driving method of the configuration of FIG. 3.

Moreover, although the period in which the row selection signal Pv1 is at the high level has been described as the period in which the first row pixels are being selected for descriptive purposes in the description based on FIG. 2, the operation pertaining to a horizontal transferring period may be performed after a transition of the signal Psel to the low level at the time t11 in FIG. 4.

According to the first embodiment of the present invention described above, the connecting unit is provided for connecting the output terminal of a register circuit to the input terminal of another resister circuit provided in a pixel column different from that in which the former resistor circuit is provided. Consequently, the number of the register circuits not participating with an operation can be decreased in comparison with that of a conventional solid-state imaging apparatus, and the utilization efficiency of the circuits thereof can be improved. Furthermore, the dynamic range thereof can be expanded by performing the operation of holding digital signals in register circuits 107 through the connecting unit which digital signals have been obtained by performing A/D conversions of analog electric signals based on incident lights into a pixel at different timings in a horizontal synchronizing period with the corresponding A/D converter 106. Incidentally, the connecting unit in the present embodiment indicates a path that changed to be on in an electric connection at the time when a column selection signal line Ph11 makes a transition to the high level with regard to the pixels in $n^{th}$ column in FIG. 1, or a path connecting different register circuits 107 with each other when a column selection signal Phn3 makes a transition to the high level.

Second Embodiment

Another embodiment of the present invention will be described.

Figure 5:
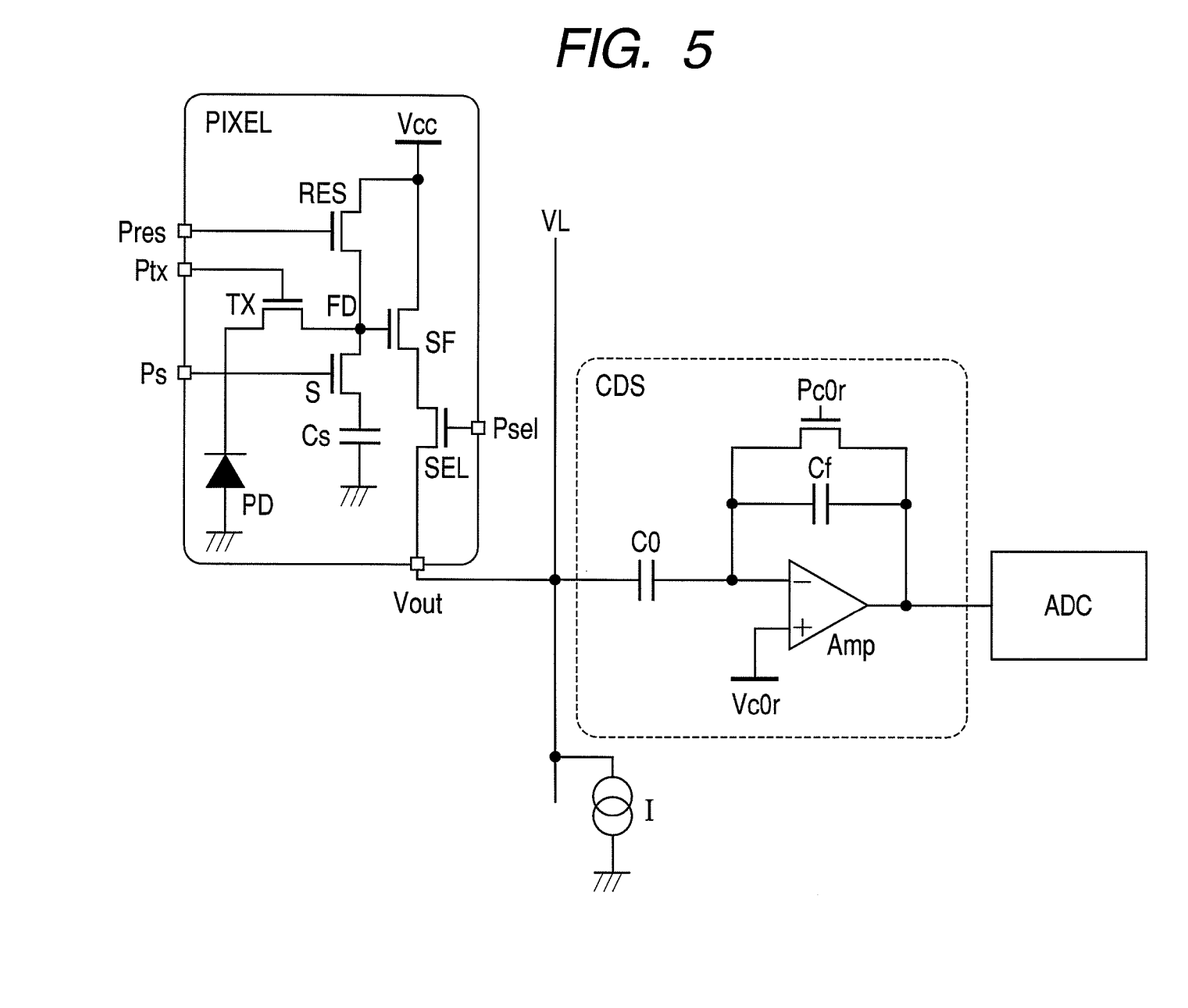
FIG. 5 is a diagram illustrating a configuration example of a pixel and CDS circuit according to a second embodiment of the present invention.

FIG. 5 is a diagram illustrating a concrete configuration of a pixel and a CDS circuit corresponding to the pixel. Because the CDS circuit has a configuration similar to the one illustrated in FIG. 3, the differentiae from the configuration of FIG. 3 are mainly described.

A storage capacitor Cs, which is a storage portion, and a switch S for controlling the connection of the floating diffusion portion FD to the storage capacitor Cs are added to the configuration illustrated in FIG. 3 in the pixel illustrated in FIG. 5. The switch S is switched between an on state in an electric connection and an off state in the electrical connection on the basis of, for example, a signal Ps given by the vertical scanning circuit 101.

Figure 6:
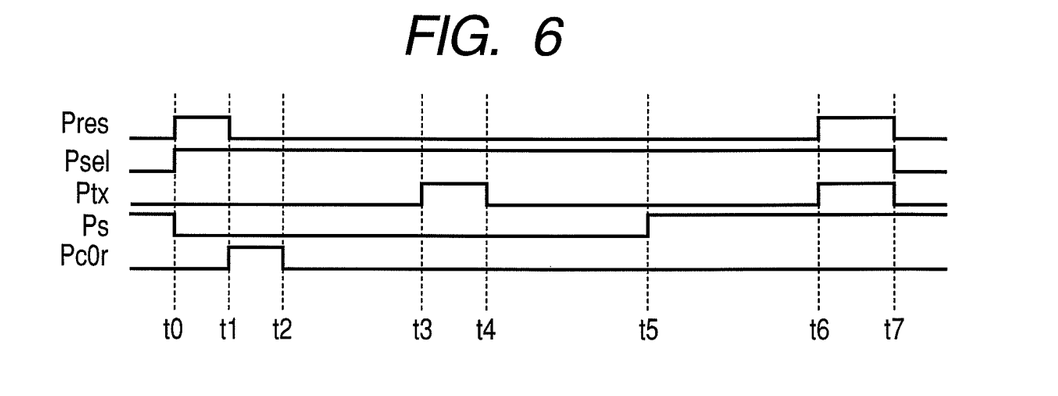
FIG. 6 is a timing chart illustrating a driving method of the configuration of FIG. 5.

FIG. 6 more minutely illustrates the operation in a period corresponding to the period of from the first horizontal blanking period to the second A/D converting period in FIG. 2. It is supposed that a light enters into the photodiode PD during a period from a time t7 in an $(n-1)^{th}$ frame to the time t0 in an $n^{th}$ frame here.

The light is entering into the photodiode PD during the period from the time t7 in the $(n-1)^{th}$ frame, at which the signals Pres, Psel, and Ptx have changed to the low level, to the time t0 in the $n^{th}$ frame. Consequently, charges of a quantity equal to or more than the charge quantity by which the photodiode PD can accumulate the charges therein are generated to the intensities of some incident lights. The charges generated to exceed the charge quantity by which the photodiode PD can accumulate the charges therein overflow the photodiode PD and are accumulated in the storage capacitor Cs, which is the storage portion.

When the signal Ps changes to the low level at the time t0 in the nth frame, the storage capacitor Cs becomes separated from the floating diffusion portion FD, and the charges that have overflowed the photodiode PD during the period from the time t7 in the $(n-1)^{th}$ frame are held in the storage capacitor Cs. Moreover, the signal Pres changes to the high level at the time t0, and thereby the floating diffusion portion FD is reset. Furthermore, because the signal Psel also changes to the high level, a signal level according to the reset of the floating diffusion portion FD appears on the signal line VL.

By the transition of the signal Pres to the low level at the time t1, the reset state of the floating diffusion portion FD of the pixel is released. The signal level appearing on the signal line Vl at this time includes a component generated by driving the reset transistor RES, and the level of the component differs in each of the pixels 103 and at each drive of the pixels. Consequently, the components operate as a noise component.

The signal Pc0r changes to the high level during a period from the time t1 to the time t2. In this period, the inverting input terminal of the amplifier Amp and the output terminal thereof are short-circuited to each other, and the charges accumulated in a feedback capacitor Cf until then are reset. The signal Pc0r makes a transition to the low level at the time t2, and consequently the signal level according to the reset of the floating diffusion portion FD is clamped in the capacitor C0.

The signal Ptx keeps the high level from the time t3 to the time t4, and the charges accumulated in the photodiode PD are thereby transferred to the floating diffusion portion FD. Then, the gate potential of the amplifying transistor SF changes according to the transferred charge quantity. In association with this, the signal level appearing on the signal line VL changes. At this timing, the signal Pc0r is at the low level, and the clamp capacitor C0 is in a floating state. Consequently, only a changed component from the clamped signal level at the time t2 is input into the inverting input terminal of the amplifier Amp. That is, a signal including the decreased noise component included in the signal level clamped at the time t2 is input into the amplifier Amp. Consequently, the noise component generated in the pixel is decreased from the signal output from the amplifier Amp. The first horizontal blanking period of the $n^{th}$ frame ends at the time t4.

The period from the time t4, at which the single Ptx makes the transition to the low level, to the time t5, at which the signal Ps changes to the high level, corresponds to the first A/D converting period, and the digital signal of the result of the A/D conversion is held in the register circuit.

When the signal Ps changes to the high level at the time t5, the storage capacitor Cs is connected to the floating diffusion portion FD, and the capacitance value of the floating diffusion portion FD becomes larger by the capacitance value of the storage capacitor Cs. The storage capacitor Cs has been holding the charges that have overflowed the photodiode PD during the period of from the time t7 in the $(n-1)^{th}$ frame to the time t0 in the $n^{th}$ frame, and the floating diffusion portion FD has been holding the charges transferred from the photodiode PD at the time t4. The state at the time t5 is that these charges are held in the floating diffusion portion FD, the capacitance value of which has increased by the capacitance value of the storage capacitor Cs. In other words, the state is that the charges that have overflowed the photodiode PD and the charges accumulated in the photodiode PD (the charges that have not overflowed the photodiode PD) are held in the floating diffusion portion FD, the capacitance value of which has increased.

The period until the time t6, at which the signals Pres and Ptx change to the high level to reset the photodiode PD, corresponds to the second A/D converting period in FIG. 2, and the digital signal of the result of the A/D conversion is held in the register circuit. An image having an expanded dynamic range can be obtained by performing arithmetic processing to the thus obtained two signals having different signal levels from each other.

When the signals Pres and Pts change to the high level at the time t6, the charges accumulated in the photodiode PD, the floating diffusion portion FD, and the storage capacitor Cs are discharged to the power source voltage Vcc, and then the pixel is reset.

The signals Psel, Pres, and Ptx make transitions to the low level at the time t7, and the selected states of the pixels of one row are reset.

Incidentally, the operation of resetting the photodiode PD executed from the time t6 does not always need performing at this timing. The operation may be also performed in a state in which no pixels are selected, such as at a timing after the signal Psel has made a transition to the low level, as long as the timing is the one after the second A/D converting period has ended.

Moreover, although the period in which the row selection signal Pv1 is being the high level has been described to be the period in which the first row pixels are being selected for descriptive purposes in the description based on FIG. 2, the operation pertaining to a horizontal transferring period may be performed after the transition of the signal Psel to the low level at the time t6 in FIG. 4.

Now, the operation of transferring the digital signal held in the register circuit 1 in the first column to the register circuit 2 in the second column is performed in the second horizontal blanking period in the operation according to FIG. 2. The operation of transferring the digital signal may be performed between the first writing period and the second A/D converting period in the present embodiment. Moreover, a signal is given from the A/D converter 106 in the first column only to the register circuit 107 in the first column in the operation according to FIG. 2. However, for example, the column selection signals Ph11 and Ph12 are simultaneously changed to the high level to write the result of the A/D conversion directly into the register circuit 107 in the second column with the A/D converter 106 in the first column in the second writing period.

According to the second embodiment of the present invention described above, the connecting unit is provided for connecting the output terminal of a register circuit to the input terminal of another resister circuit provided in a pixel column different from that in which the former resistor circuit is provided. Consequently, the number of the register circuits not participating in an operation can be decreased in comparison with that of a conventional solid-state imaging apparatus, and the utilization efficiency of the circuits thereof can be improved. Furthermore, the dynamic range thereof can be expanded by performing the operation of holding digital signals in the register circuits 107 through the connecting unit, which digital signals have been obtained by performing the A/D conversions of analog electric signals based on incident lights into a pixel at different timings in a horizontal synchronizing period with the corresponding A/D converter 106. Incidentally, the connecting unit in the present embodiment indicates a path that changes to be on in an electric connection at the time when the column selection signal line Ph11 makes a transition to the high level with regard to the pixels in the $n^{th}$ column in FIG. 1, or a path connecting different register circuits 107 with each other when the column selection signal Phn3 makes a transition to the high level. Then, if the A/D converter 106 in the $n^{th}$ column writes the result of an A/D conversion into the register circuit 107 in another column, the connecting unit also indicates the path that changes to be on in an electric connection when a column selection signal phn2 makes a transition to the high level.

Third Embodiment

A third embodiment according to the present invention will be described.

Although the CDS circuits 114 are provided in the respective columns of the pixels 103 in the first and second embodiments, it is not always needed to perform the CDS processing at the preceding stages of the A/D converters 106.

Figure 7:
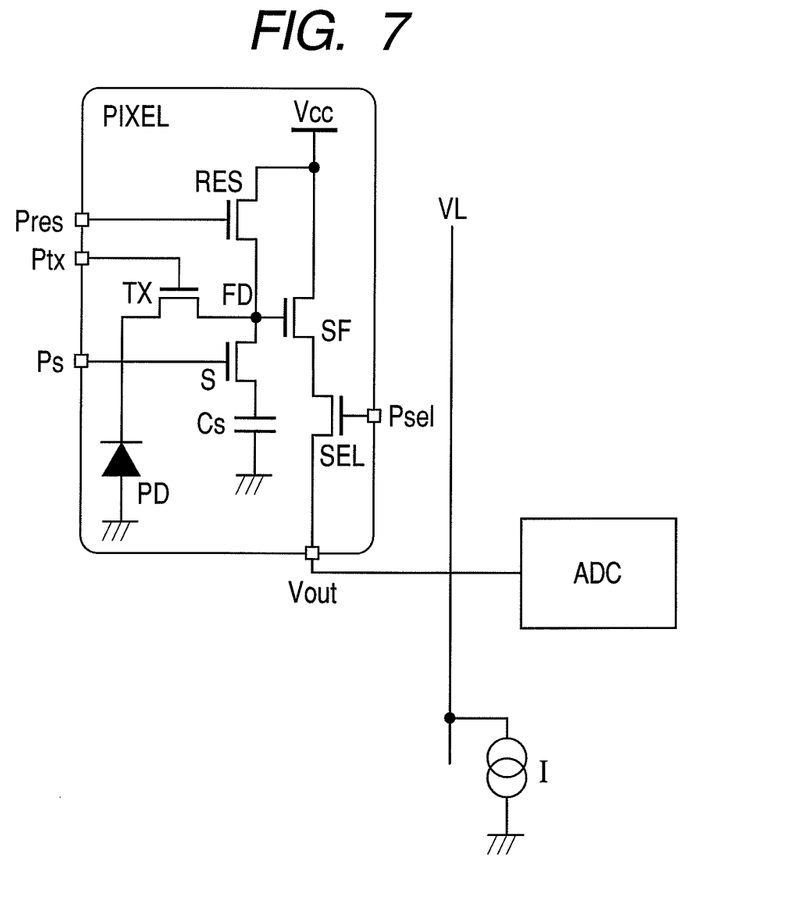
FIG. 7 is a diagram illustrating a configuration example of a pixel according to a third embodiment of the present invention.
Figure 8:
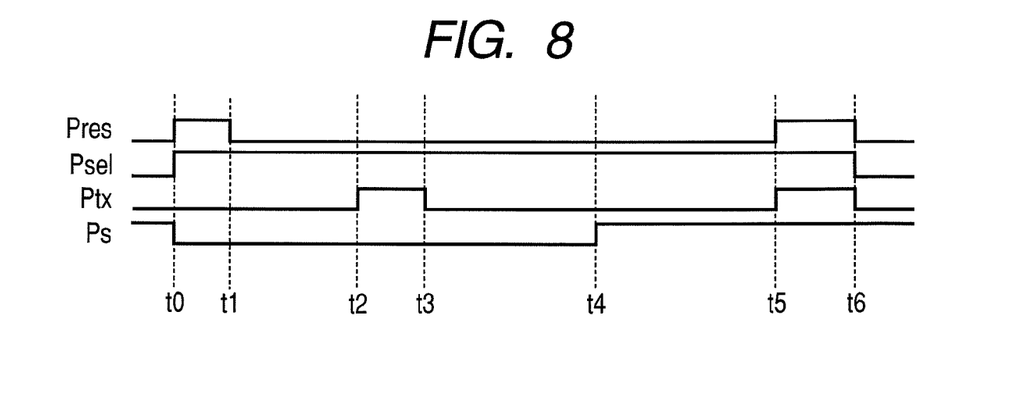
FIG. 8 is a timing chart illustrating a driving method of the configuration of FIG. 7.

For example, the configuration illustrated in FIG. 7, in which the CDS circuit is omitted from the configuration illustrated in FIG. 5, is considered. An operation according to the configuration is illustrated in FIG. 8. The case of using the digital signals based on the pixels of a column in every three columns is considered in the present embodiment. That is, the case is the one in which the digital signals based on the pixels in the first, fourth, seventh, and so forth columns are used and the register circuits in the second, third, fifth, sixth and so forth columns are not used.

Moreover, similarly to the second embodiment, it is supposed that a light enters a photodiode PD in a period from the time t7 in the $(n-1)^{th}$ frame to the time t0 in the $n^{th}$ frame also in the present embodiment.

Operations of the pixels in a first column will be described.

The light is entering into the photodiode PD during the period from the time t6 in the $(n-1)^{th}$ frame, at which the signals Pres, Psel, and Ptx have changed to the low level, to the time t0 in the $n^{th}$ frame. Consequently, charges of a quantity equal to or more than the charge quantity by which the photodiode PD can accumulate the charges therein are generated to the intensities of some incident lights. The charges generated to exceed the charge quantity by which the photodiode PD can accumulate the charges therein overflow the photodiode PD and are accumulated in the storage capacitor Cs, which is the storage portion.

When the signal Ps changes to the low level at the time t0 in the nth frame, the storage capacitor Cs becomes separated from the floating diffusion portion FD, and the charges that have overflowed the photodiode PD during the period from the time t7 in the $(n-1)^{th}$ frame are held in the storage capacitor Cs. Moreover, the signal Pres changes to the high level at the time t0, and thereby the floating diffusion portion FD is reset. Furthermore, because the signal Psel also changes to the high level, a signal level according to the reset of the floating diffusion portion FD appears on the signal line VL.

By the transition of the signal Pres to the low level at the time t1, the reset state of the floating diffusion portion FD of the pixel is released. The signal level appearing on the signal line Vl at this time includes a component generated by driving the reset transistor RES, and the level of the component differs in each of the pixels 103 and at each drive of the pixels different. Consequently, the component operates as a noise component. The signal level (N signal) corresponding to the noise component is converted into a digital signal by an ADC 106 in a period until the time t2, and the result of the A/D conversion is held by a register circuit 107. The register 107 in which the result of the A/D conversion is held may be any of the register circuits 107 in the first to third columns here.

When the signal Ptx changes to the high level at the time t2, the charges accumulated in the photodiode PD are transferred to the floating diffusion portion FD. Then, the accumulation time of the photodiode PD ends by the transition of the signal Ptx to the low level at the time t3. A signal level (S+N signal), which is the superposition of the N signal and a signal component (S signal) based on the charges accumulated in the photodiode PD and transferred to the floating diffusion portion FD in the period from the end of the accumulation time to the time t4, appears on the signal line VL. The result of the A/D conversion of the S+N signal with the ADC 106 is held in a register circuit 107 different from the one in which the N signal is held.

When the signal Ps changes to the high level at the time t4, the magnitude of the capacity connected to the floating diffusion portion FD becomes larger. Then the signal level appearing on the signal line VL becomes smaller.

The storage capacitor Cs is connected to the floating diffusion portion FD, and the capacitance value of the floating diffusion portion FD becomes larger by the capacity of the storage capacitor Cs. The storage capacitor Cs has been holding the charges that have overflowed the photodiode PD during the period from the time t6 in the $(n-1)^{th}$ frame to the time t0 in the $n^{th}$ frame, and the floating diffusion portion FD has been holding the charges transferred from the photodiode PD at the time t3. The state at the time t4 is that these charges are held in the floating diffusion portion FD, the capacitance value of which has increased by the capacity of the storage capacitor Cs. In other words, the state is that the charges that have overflowed the photodiode PD and the charge accumulated in the photodiode PD (the charges that have not overflowed the photodiode PD) are held in the floating diffusion portion FD, the capacitance value of which has increased. The signal level at this time is denoted by an N+S+W signal. The result of the A/D conversion by the ADC 106 in the period until the time t5 is held in a register circuit 107 different from those of the N signal and the N+S signal.

The signals Pres and Ptx change to the high level at the time t5, and thereby the charges accumulated in the photodiode PD, the floating diffusion portion FD, and the storage capacitor Cs are discharged to the power source voltage Vcc. When the signal Ptx changes to the low level at the time t6, the photodiode PD becomes the state capable of accumulating charges again. Moreover, the signal Psel changes to the low level at the time t6, and the selection state of the pixel is released. Although the photodiode PD is reset in the period from the time t5 to the time t6 here, the reset operation may be performed after the change of the signal Psel to the low level.

The N signal, the N+S signal, and the N+S+W signal, held in the respective three register circuits 107, are examined. For example, the arithmetic operation circuit 109 performs the subtraction processing between the N signal and the N+S signal and the subtraction processing between the N signal and the N+S+W signal to obtain two signals including decreased noise components. By synthesizing these two signals, the dynamic range of the synthesized signal can be expanded.

Moreover, although the case of using the digital signals based on the pixels of one column in every three columns has been described here, the case of using the digital signals based on the pixels of one column in every other column may be adopted. In that case, the digital signals based on the N signal and the N+S signal are first held in the register circuits 107 different from each other, and after that, the arithmetic operation circuit 109 performs the subtraction processing. Then, the digital signal based on the N signal is left to be held in one register circuit 107, and the digital signal based on the N+S+W signal is held in another register circuit 107. Then, the arithmetic operation circuit 109 performs the subtraction processing between both the held signals. After that, the two signals including the decreased components corresponding to the N signals are synthesized with each other, and thereby the dynamic range of the synthesized signal can be expanded.

As described above, even if the CDS circuits 114 are not provided in the preceding stages of the ADCs 106, the noise components can be decreased by changing the driving timings, and thereby the dynamic range of signals can be expanded. Furthermore, by performing the operation of holding a digital signal into a register circuit 107 through a connecting unit which digital signal has been obtained by performing A/D conversions of analog electric signals based on incident lights into one pixel 103 at different timings in one horizontal synchronizing period with an A/D converter 106, the dynamic range of the signal can be expanded.

Fourth Embodiment

Figure 9:
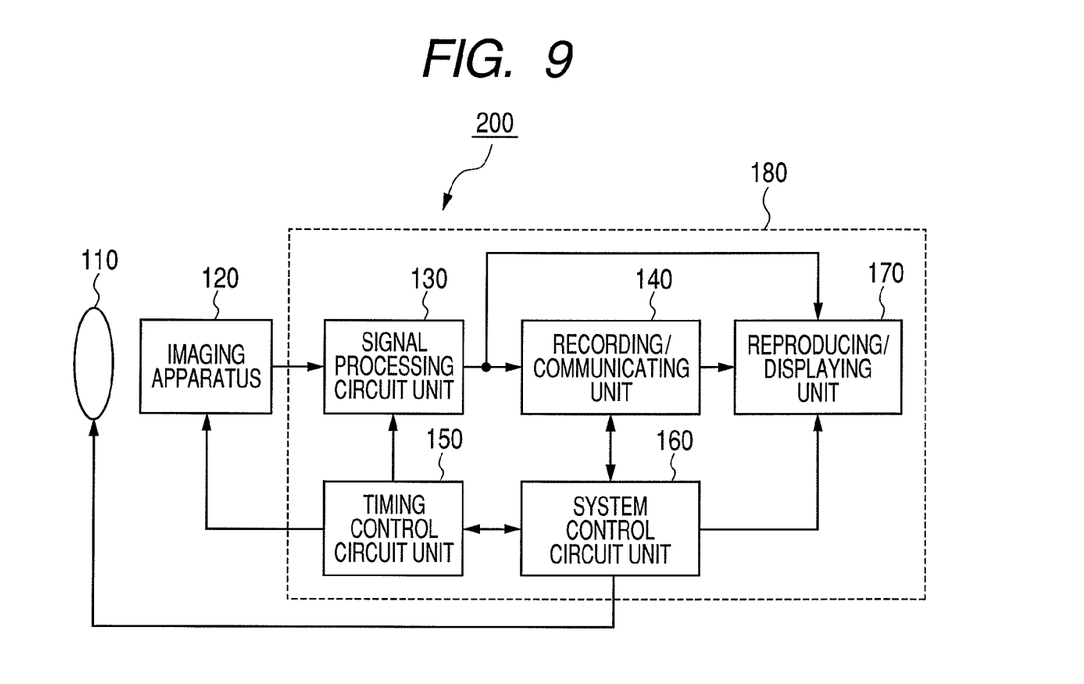
FIG. 9 is a block diagram of an imaging system according to a fourth embodiment of the present invention.

The schematic configuration and schematic operation of an imaging system 200 according to a fourth embodiment of the present invention will be described with reference to FIG. 9. FIG. 9 is a configuration diagram of the imaging system 200 according to the present embodiment.

The imaging system 200 is equipped with an optical system 110, a solid-state imaging apparatus 120, and a signal processing unit 180. The signal processing unit 180 includes a signal processing circuit unit 130, a recording/communicating unit 140, a timing control circuit unit 150, a system control circuit unit 160, and a reproducing/displaying unit 170.

The optical system 110 forms the image of a subject on a pixel arrangement, which is the imaging surface of the solid-state imaging apparatus 120.

The solid-state imaging apparatus 120 is a solid-state imaging apparatus according to, for example, the first embodiment. The solid-state imaging apparatus 120 converts the image of a subject formed on the pixel arrangement into an image signal. The solid-state imaging apparatus 120 reads out the image signal from the pixel arrangement to output the read out image signal to the signal processing circuit unit 130.

The signal processing circuit unit 130 performs signal processing, such as the compression processing of image data, to the image signal supplied from the solid-state imaging apparatus 120 in conformity with a previously determined method. The signal processing circuit unit 130 supplies the image data subjected to the signal processing to the recording/communicating unit 140 and the reproducing/displaying unit 170.

The recording/communicating unit 140 records the image data supplied from the signal processing circuit unit 130 onto a not illustrated recording medium, and transmits the image data to a similarly not illustrated external apparatus. Alternatively, the recording/communicating unit 140 reads out image data from the recording medium to supply the read out image data to the reproducing/displaying unit 170, and receives a predetermined instruction from a not illustrated input unit to supply the received instruction to the system control circuit unit 160.

The reproducing/displaying unit 170 displays the image data supplied from the signal processing circuit unit 130 or the recording/communicating unit 140 on a display device.

The timing control circuit unit 150 supplies the signals for controlling the timings of driving the solid-state imaging apparatus 120, and has the role of a mode switching unit. For example, the timing control circuit unit 150 supplies a signal for driving the solid-state imaging apparatus 120 in the mode of performing a horizontal thinning-out operation, and supplies a signal for driving the solid-state imaging apparatus 120 in the mode of reading out the signals of all of the pixels.

The system control circuit unit 160, which is a control unit, receives the information of the predetermined instruction from the recording/communicating unit 140. The system control circuit unit 160 controls the optical system 110, the recording/communicating unit 140, the reproducing/displaying unit 170, and the timing control circuit unit 150 in obedience to the predetermined instruction. For example, the system control circuit unit 160 controls the optical system 110, the recording/communicating unit 140, the reproducing/displaying unit 170, and the timing control circuit unit 150 in obedience to an all pixel reading-out mode and a thinning-out reading-out mode. Moreover, for example, the system control circuit unit 160 gives a control signal to each unit of the imaging system in obedience to a drive mode for reading out image data having an expanded dynamic range.

According to the present embodiment, a digital signal can be held in a register circuit provided in a column of the pixels that are not read out at a thinning out operation. Hereby, when a horizontal thinning-out operation is performed, the number of the register circuits that do not participate with the operation can be decreased, and the arithmetic processing, such as addition, averaging, and subtraction (difference), can be realized with the utilization efficiency of the circuits improved.

The configuration in which the arithmetic operation circuit 109 and the selector 110 are included within the solid-state imaging apparatus 120 has been given in any of the embodiments described above, but the arithmetic operation circuit 109 and the selector 110 are not always needed to be provided with solid-state imaging apparatus 120. For example, the arithmetic operation circuit 109 and the selector 110 may be provided in the signal processing circuit unit 130 in FIG. 9. In this case, the area of the semiconductor substrate of the solid-state imaging apparatus 120 can be decreased, and further the advantages described above can be obtained. The important matter of the present invention is to have a configuration capable of holding a digital signal and a register circuit provided in a column of pixels from which no signals are read out at the time of performing a horizontal thinning-out operation.

(Others)

Figure 10:
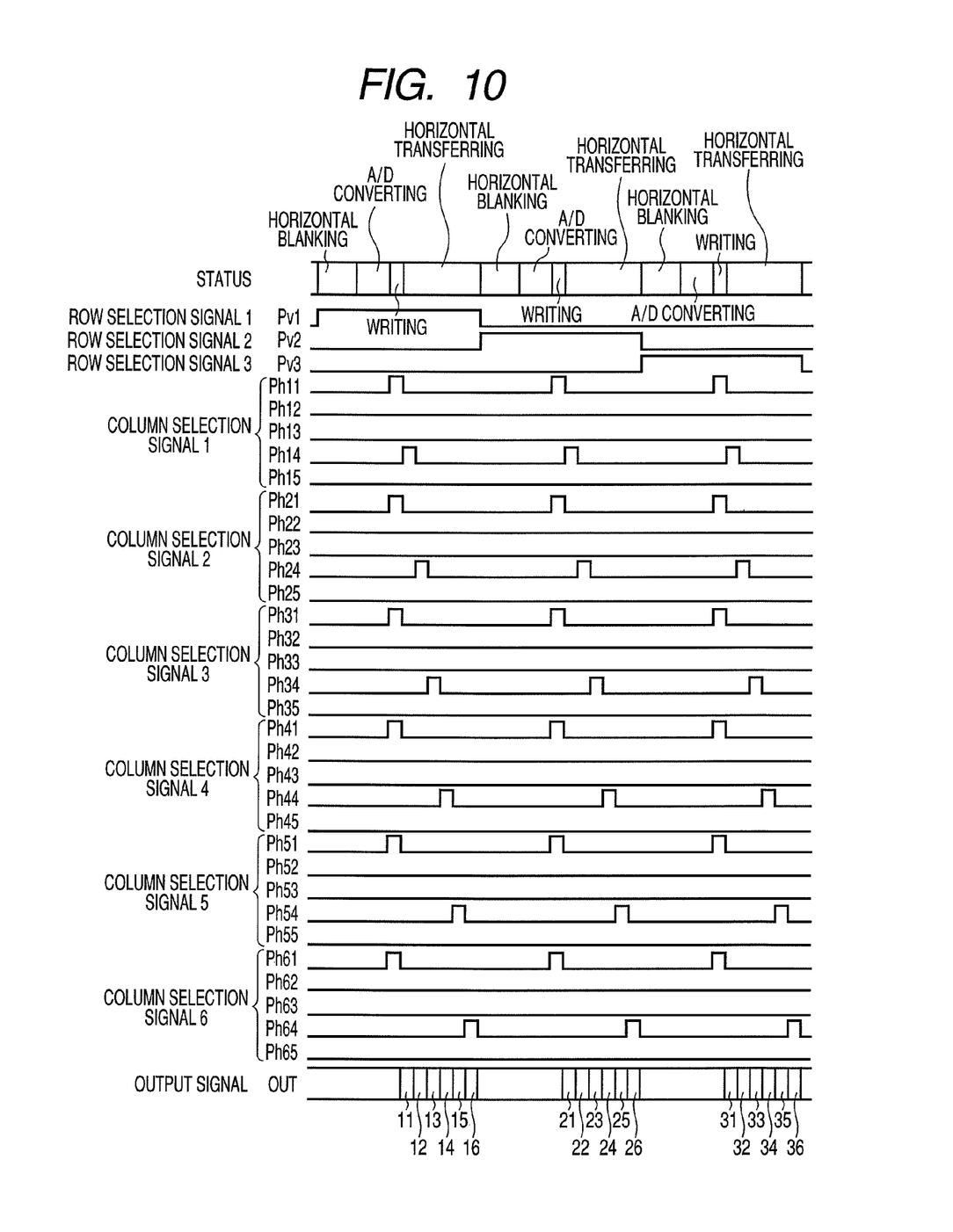
FIG. 10 is a timing chart illustrating an example of a driving method of a solid-state imaging apparatus of FIG. 1.

Although the examples of performing thinning out operations of using signals based on the pixels of a column in every plurality of columns have been described in the above, the configuration illustrated in FIG. 1 can output signals without performing any thinning out and expansions of dynamic ranges. FIG. 10 illustrates the driving method. The driving method is the one to be performed in the case where a high resolution is required in still image photographing and the like.

In the present driving method of reading out signals from all the pixels, a horizontal transfer operation is performed in the period of reading out each row. First, in the horizontal blanking and A/D converting statuses of the first row, the analog electric signals from the pixels of the first row are subjected to noise cancellation in the corresponding CDS, and are output as digital signals from the corresponding ADC.

In the next writing status, column selection signals Ph11, Ph21, . . . simultaneously change to the high level, and the digital signals output from the ADC in each column are held in the register circuit in each of the columns.

In the successive horizontal transferring status, column selection signals Ph14, Ph24, . . . change to the high level in order, and the digital signals held in each of the register circuits is sequentially output to the horizontal output line 112. The digital signals output on the horizontal output line 112 are output to the outside of the solid-state imaging apparatus through the selector 110.

Operations are similarly performed on and after the second row, and thereby the signals of all of the pixels can be sequentially output in the solid-state imaging apparatus illustrated in FIG. 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-118807, filed Apr. 30, 2008, which is hereby incorporated by reference herein its entirety.

What is claimed is:

1. A solid-state imaging apparatus comprising:
    a plurality of pixels arranged in a matrix, each photoelectrically converting an incident light into an analog electric signal and outputting the analog electric signal;
    an A/D converter arranged correspondingly to each of columns of the pixels, for A/D converting the analog electric signal from one of the pixels into a digital signal and for outputting the digital signal from an output terminal of the A/D converter;
    a register circuit arranged correspondingly to each of the columns of the pixels; and
    a connecting unit for connecting the output terminal of the A/D converter arranged correspondingly to one of the columns of the pixels to an input terminal of the register circuit arranged correspondingly to the one column of the pixels, for connecting the output terminal of the A/D converter arranged correspondingly to the one of the columns of the pixels to an input terminal of the register circuit arranged correspondingly to another of the columns of the pixels, or for connecting an output terminal of the register circuit arranged correspondingly to the one of the columns of the pixels to the input terminal of the register circuit arranged correspondingly to the other of the columns of the pixels, wherein
    the register circuit arranged correspondingly to the one column of the pixels receives by the input terminal thereof the digital signal from the output terminal of the A/D converter or from the output terminal of the register circuit arranged correspondingly to the other column of the pixels, and
    the analog electric signal from one of the pixels based on the incident light is A/D converted by the A/D converter in different timings within one horizontal synchronizing period to a plurality of the digital signals, and the plurality of the digital signals are held by different ones of the register circuits through the connecting unit.

2. The solid-state imaging apparatus according to claim 1, wherein
the plurality of the digital signals A/D converted in different timings by the A/D converter arranged correspondingly to the one column of the pixels include:
one digital signal input through the connecting unit to the register circuit arranged correspondingly to the one column of the pixels; and
another digital signal input through the connecting unit to the register circuit arranged correspondingly to the one column of the pixels, and thereafter transferred through the connecting unit to the register circuit arranged correspondingly to the other column of the pixels.

3. The solid-state imaging apparatus according to claim 1, wherein
the plurality of the digital signals A/D converted in different timings by the A/D converter arranged correspondingly to the one column of the pixels includes:
one digital signal input through the connecting unit to the register circuit arranged correspondingly to the one column of the pixels; and
another digital signal input through the connecting unit to the register circuit arranged correspondingly to the other column of the pixels.

4. The solid-state imaging apparatus according to claim 1, further comprising
an arithmetic processing unit for subjecting to an arithmetic processing the digital signals outputted in parallel from the output terminals of the register circuits.

5. The solid-state imaging apparatus according to claim 1, wherein
the digital signals A/D converted by the A/D converter from the analog electric signal of the one pixel based on the incident light in different timings within one horizontal synchronizing period to a plurality of the digital signals are based on the analog electric signals generated by the conversion of the incident light during periods of respectively different lengths.

6. The solid-state imaging apparatus according to claim 1, wherein
each of the pixels includes
a photoelectric conversion portion for accumulating a carrier based on the incident light;
a floating diffusion portion;
an amplifying portion for outputting the analog electric signal based on a potential of the floating diffusion portion;
a storage portion; and
a switch for switching between on and off of an electrical connection between the storage portion and the floating diffusion portion, wherein
the digital signals A/D converted by the A/D converter from the analog electric signal of the one pixel based on the incident light in different timings within one horizontal synchronizing period to a plurality of the digital signals are respectively based on the analog electric signal generated during an on state of the switch, and based on the analog electric signal generated during an off state of the switch.

7. A driving method of the solid-state imaging apparatus according to claim 1, comprising a step of:
performing horizontal skipped reading out including a step of transferring the digital signal, generated based on the analog signal from a pixel of the row to be read out, to the register circuit arranged correspondingly to the row including pixels not to be read out.

* * * * *